United States Patent [19]

Alexander

[11] 4,444,318
[45] Apr. 24, 1984

[54] SNAP-IN SPACING DEVICE FOR CIRCUIT BOARDS

[75] Inventor: Donnald A. Alexander, Tigard, Oreg.

[73] Assignee: Tektronix, Inc., Beaverton, Oreg.

[21] Appl. No.: 376,330

[22] Filed: May 10, 1982

[51] Int. Cl.³ .............................................. F16B 19/00
[52] U.S. Cl. ....................................... 211/41; 361/412
[58] Field of Search .............. 211/41, 188; 248/316.9, 248/239; 361/412, 413; 174/138 D

[56] References Cited

U.S. PATENT DOCUMENTS

| | | | |
|---|---|---|---|
| 3,271,747 | 9/1966 | Harner et al. | 361/412 X |
| 3,320,483 | 5/1967 | Pohl | 211/41 X |
| 3,404,785 | 10/1968 | Emary | 248/316.9 X |
| 3,568,001 | 3/1971 | Straus | 361/413 |
| 3,688,635 | 9/1972 | Fegen | 361/412 X |
| 3,836,703 | 9/1974 | Coules | 361/412 X |
| 3,996,500 | 12/1976 | Coules | 248/316.9 X |
| 4,200,900 | 4/1980 | McGeorge | 361/412 |

Primary Examiner—Ramon S. Britts
Assistant Examiner—Robert W. Gibson, Jr.
Attorney, Agent, or Firm—George T. Noe

[57] ABSTRACT

A one-piece snap-in spacing device and support member for circuit boards is provided with a tapered pin axially disposed at each end of a spacer body to fit snugly into corresponding holes positioned near the edges of a pair of circuit boards. Integrally molded with the spacer body is a pair of clips each having a ramped nib to engage and grip the edge of a circuit board with a snapping action. The spacing device is provided with a flat surface for mounting to a chassis.

4 Claims, 5 Drawing Figures

U.S. Patent      Apr. 24, 1984      4,444,318
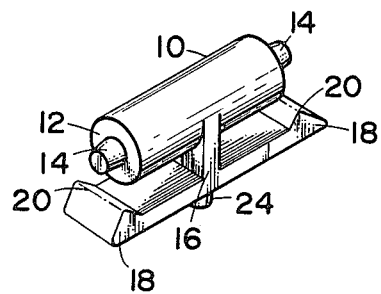
Fig. 1.
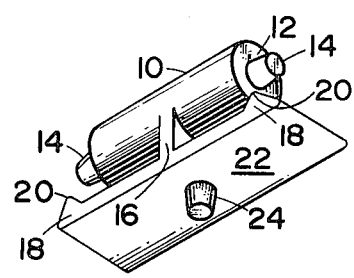
Fig. 2.
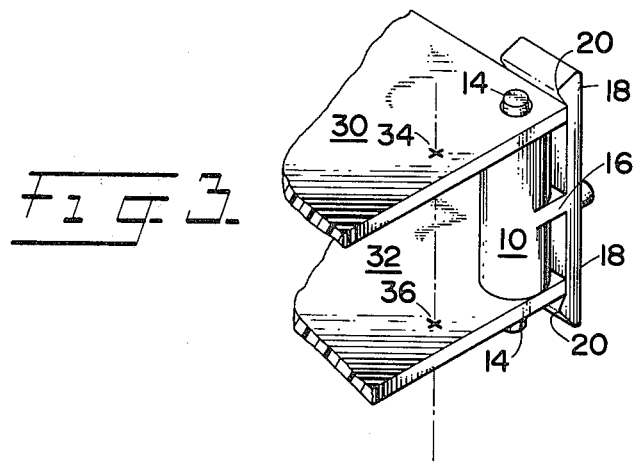
Fig. 3.
Fig. 4.
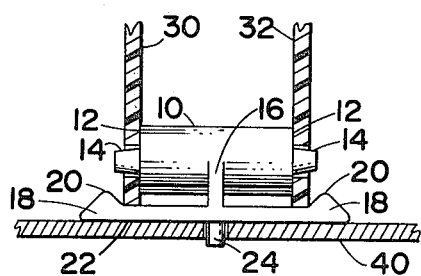
Fig. 5.
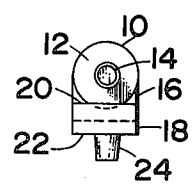

SNAP-IN SPACING DEVICE FOR CIRCUIT BOARDS

BACKGROUND OF THE INVENTION

The present invention relates generally to mounting supports for printed circuit boards, and in particular to a snap-in spacing device for arranging two circuit boards in spaced parallel relationship for installation in an electronic instrument.

It is often desired to arrange circuit boards in spaced parallel relationship to provide a compact circuit board assembly for installation in an electronic instrument. The usual method of joining circuit boards is to use spacers of uniform length, and screws to assemble the circuit boards to the spacers. There are, however, one-piece snap-in spacers such as taught by U.S. Pat. No. 3,688,635 which permit joining circuit boards in spaced relationship without the use of additional hardware or tools. In these devices, however, the locking members pass through holes in the circuit board, thus requiring such holes to be larger than necessary—certainly larger than the diameter of the shaft passing therethrough. As a consequence, some lateral movement of one circuit board with respect to the other is permitted, making it difficult to mate components or connectors between the two circuit boards. Furthermore, positioning the assembled circuit boards within an instrument has heretofore required additional spacers or hardware.

SUMMARY OF THE INVENTION

In accordance with the present invention, a one-piece snap-in spacing device and support member for circuit boards is provided with a tapered pin axially disposed at each end of a spacer body portion to fit snugly into corresponding holes positioned near the edges of a pair of circuit boards. Integrally molded with the spacer body portion is a pair of clips each having a ramped nib to engage and grip the edge of the circuit board with a snapping action. The external surface of the clips is substantialy flat to provide engagement with a mounting member, such as a chassis, and the preferred embodiment of the present invention includes a member protruding from the flat surface to project into a mounting hole in the chassis.

It is therefore one object of the present invention to provide a snap-in spacing and support device for rigidly holding a pair of circuit boards in spaced parallel relationship while maintaining a condition of correct alignment or register of one circuit board relative to the other.

It is another object of the present invention to provide a snap-in spacing and support device for circuit boards in which the locking members of the spacing device grip the edges of the circuit boards.

It is a further object of the present invention to provide a snap-in spacing device for circuit boards which facilitates installation of a circuit board assembly to a chassis without the need for additional hardware.

Other objects, features, and advantages of the present invention will become apparent to those having ordinary skill in the art upon a reading of the following description when taken in conjunction with the drawings.

BRIEF DESCRIPTION OF THE DRAWINGS

FIG. 1 is a first perspective view of a snap-in spacing device for circuit boards in accordance with the present invention;

FIG. 2 is a second perspective view of a snap-in spacing device for circuit boards;

FIG. 3 is a perspective view of a snap-in spacing device holding a pair of circuit boards in spaced relationship;

FIG. 4 is a side elevation view of a snap-in spacing device holding a pair of circuit boards and mounted on a chassis; and FIG. 5 is an end plan view of a snap-in spacing device for circuit boards.

DETAILED DESCRIPTION OF THE INVENTION

FIGS. 1 and 2 illustrate a snap-in spacing and support device in accordance with the preferred embodiment. The spacing device comprises a spacer body portion 10 having spaced-apart parallel surfaces 12 at opposite ends of such body portion 10, and a tapered pin 14 axially disposed at each end of the spacer body and extending from the surface 12 to fit snugly into corresponding holes positioned near the edges of a pair of circuit boards. Integrally molded with the spacer body and spaced therefrom by a generally centrally-located web 16 is a pair of resilient clips 18 each having a ramped nib 20 at a free end thereof to engage and grip the edge of the circuit board with a snapping action. The external surface 22 of the clips 18 is substantially flat, defining a planar surface parallel to the longitudinal axis of the spacer body 10 to provide engagement with a chassis. Extending from the planar surface along an axis transverse to the axis of the spacer body 10 is a mounting peg 24 for projecting into a mounting hole in a chassis.

In FIGS. 3 and 4, a pair of circuit boards 30 and 32 are held in spaced relationship by the spacing device of the present invention. The circuit boards are assembled thereon by aligning a hole in the circuit board onto the tapered pin 14 and at the same time engaging the ramped nib 20 at the free end of clip 18. The circuit board is then pressed into position so that the clip snaps over the edge of the board, seating the board firmly on the bearing surface 12. In the installed position, the tapered pin 14 fits snugly into the hole in the circuit board to prevent lateral movement. Thus two circuit boards may be assembled together in spaced relationship so that two points 34 and 36 are in correct alignment or registration. The points 34 and 36 may be, for example, small holes through which square pin connectors pass, or they may represent the points at which components on opposing circuit boards mate. With several such snap-in spacing devices arranged around the edges of the circuit boards, a rigid assembly is provided.

In FIG. 4, the circuit board assembly comprising circuit boards 30 and 32 held together by the spacing device of the present invention is shown mounted to a chassis 40 with the flat surface 22 bearing on the planar surface of the chassis and the mounting peg 24 extending through a mounting hole in the chassis. It can be appreciated that, depending upon the size of the circuit boards, one or more spacing devices can be utilized to mount the circuit board to a chassis without any additional hardware, thereby facilitating installation of such circuit board assemblies into electronic instruments.

FIG. 5 shows an end view of the snap-in spacing device to illustrate the simple construction thereof. While the spacer body 10 is shown having a generally cylindrical shape, it could be box shaped as well. The entire spacing device may be injection molded of a resilient material having dielectric properties, such as nylon or plastic.

Although the present invention has been described in connection with a particular embodiment thereof, it is to be understood that additional embodiments, modifications, and applications thereof which will be obvious to those skilled in the art are included within the spirit and scope of the invention. For example, rather than a mounting peg 24, the flat surface 22 could include a tapped hole for insertion of a mounting screw for securely mounting to a chassis.

What I claim as being new is:

1. A one-piece spacing device for circuit boards, comprising:
   a spacer body;
   pin means axially disposed at each end of said body for insertion into a corresponding hole in a circuit board; and
   clip means attached to said body and spaced apart therefrom for gripping a circuit board, said clip means comprising a resilient member extending along said body in both directions from a fixed central portion to a pair of free ends, each of said free ends including a nib positioned near a respective end of said body for gripping said circuit board.

2. A spacing device in accordance with claim 1 wherein said body has a substantially flat surface at each end thereof for seating said circuit board, and said pin means comprises a tapered pin extending from each of said flat surfaces.

3. A spacing device in accordance with claim 1 wherein said clip means includes a substantially flat surface for engaging a mounting member.

4. A spacing device in accordance with claim 3 further including peg means extending from said flat surface of said clip means for insertion into a corresponding hole in said mounting member.

* * * * *